(12) United States Patent
Villa et al.

(10) Patent No.: US 11,251,580 B2
(45) Date of Patent: Feb. 15, 2022

(54) INTEGRATED OPTICAL DEVICE WITH A WAVEGUIDE AND RELATED MANUFACTURING PROCESS

(71) Applicant: STMICROELECTRONICS S.R.L., Agrate Brianza (IT)

(72) Inventors: Flavio Francesco Villa, Milan (IT); Guido Chiaretti, Milan (IT); Gabriele Barlocchi, Cornaredo (IT)

(73) Assignee: STMICROELECTRONICS S.R.L., Agrate Briaza (IT)

( * ) Notice: Subject to any disclaimer, the term of this patent is extended or adjusted under 35 U.S.C. 154(b) by 153 days.

(21) Appl. No.: 16/669,438

(22) Filed: Oct. 30, 2019

(65) Prior Publication Data
US 2020/0136342 A1 Apr. 30, 2020

(30) Foreign Application Priority Data
Oct. 31, 2018 (IT) .......................... 102018000009950

(51) Int. Cl.
*H01S 5/026* (2006.01)

(52) U.S. Cl.
CPC .................................. *H01S 5/0261* (2013.01)

(58) Field of Classification Search
CPC .............. G02B 6/12; G02B 6/12002; G02B 2006/12083; G02B 2006/12085; G02B 2006/12097; G02B 2006/121; G02B 2006/12178; H01S 5/00; H01S 5/0206; H01S 5/0207; H01S 5/0261; H01S 5/026
See application file for complete search history.

(56) References Cited

U.S. PATENT DOCUMENTS

| | | | |
|---|---|---|---|
| 6,545,335 B1* | 4/2003 | Chua | H01S 5/0261 257/446 |
| 7,257,138 B2* | 8/2007 | Sato | B82Y 20/00 372/36 |
| 8,173,513 B2 | 5/2012 | Villa et al. | |
| 2003/0165169 A1* | 9/2003 | Nomoto | H01S 5/04254 372/46.01 |
| 2005/0259937 A1 | 11/2005 | Whaley, Jr. et al. | |

(Continued)

FOREIGN PATENT DOCUMENTS

| | | | | |
|---|---|---|---|---|
| CN | 1323056 A | * | 11/2001 | ....... H01L 27/10897 |
| CN | 107104119 A | | 8/2017 | |

(Continued)

OTHER PUBLICATIONS

Armbruster et al., "A Novel Micromachining Process For the Fabrication of Monocrystalline SI-Membranes Using Porous Silicon," The 12$^{th}$ International Conference on Solid State Sensors, Actuators and Microsystems, Jun. 8-12, 2003, Boston, Massachusetts, pp. 246-249.

(Continued)

*Primary Examiner* — Thomas A Hollweg
*Assistant Examiner* — Mary A El-Shammaa
(74) *Attorney, Agent, or Firm* — Seed IP Law Group LLP

(57) ABSTRACT

An integrated optical device, including: a semiconductor body delimited by a top surface; and at least one buried cavity, which extends in the semiconductor body, at a distance from the top surface, so as to delimit at the bottom a front semiconductor region, which functions as an optical guide.

25 Claims, 16 Drawing Sheets

(56) References Cited

U.S. PATENT DOCUMENTS

| | | | |
|---|---|---|---|
| 2013/0265624 A1* | 10/2013 | Zheng | G02B 6/122 359/15 |
| 2017/0194764 A1 | 7/2017 | Evans et al. | |
| 2021/0151953 A1* | 5/2021 | Osinski | H01S 5/12 |

FOREIGN PATENT DOCUMENTS

| | | | | |
|---|---|---|---|---|
| GB | 2561426 A | 10/2018 | | |
| WO | WO-2017200620 A2 * | 11/2017 | | H01S 5/4006 |

OTHER PUBLICATIONS

Churenkov, "Silicon micromechanical optical waveguide for sensing and modulation," *Sensors and Actuators A* 57:21-27, 1996.

Sadeghi et al., "Evanescent Coupling of a Center-Cleaved Mid-Infrared Quantum Cascade Laser to a Suspended Silicon-on-insulator Waveguide," *11$^{th}$ International Conference on Group IV Photonics,* Aug. 27-29, 2014, Paris, France, pp. 27-29.

* cited by examiner

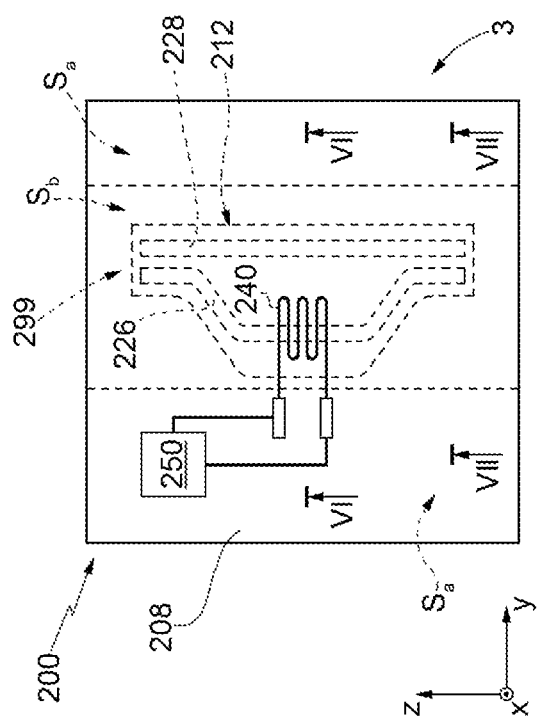
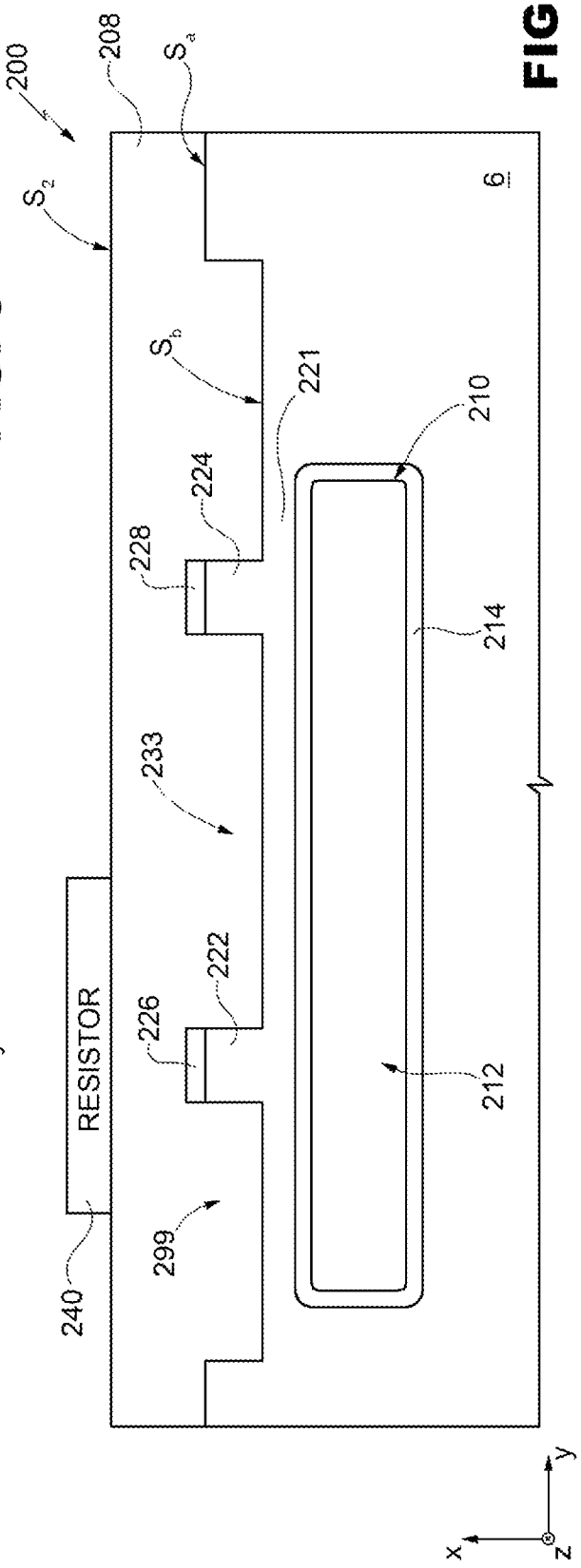
FIG. 5
FIG. 6

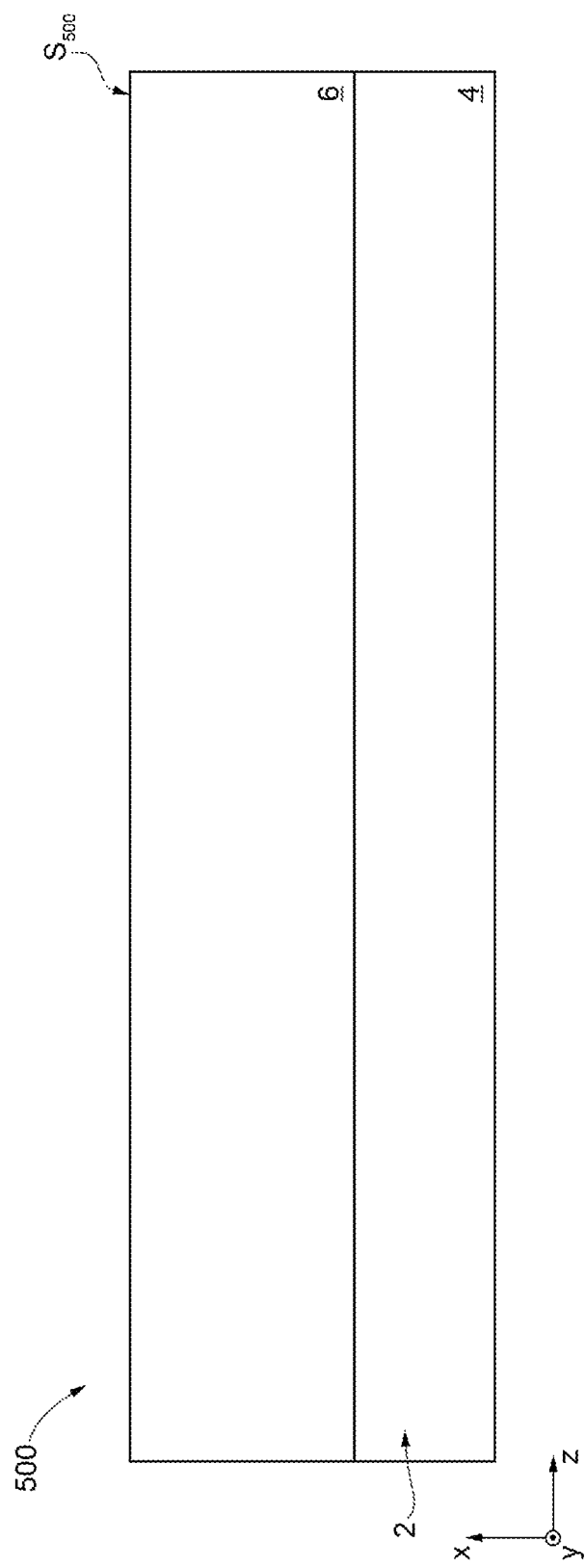

INTEGRATED OPTICAL DEVICE WITH A WAVEGUIDE AND RELATED MANUFACTURING PROCESS

BACKGROUND

Technical Field

The present disclosure relates to an integrated optical device including at least one waveguide, as well as to the related manufacturing process.

Description of the Related Art

As is known, there are currently available optoelectronic devices obtained using the so-called silicon-photonics technology and grown on silicon-on-insulator (SOI) wafers, each of which includes a buried oxide layer (referred to as "BOX"), which is arranged on a substrate of semiconductor material and has a thickness typically of not greater than 2-3 µm.

The extremely small thickness of the oxide layer, associated to the thicknesses typical of silicon waveguides (220-400 nm), means that the waveguides that are formed within such optoelectronic devices have relatively high losses. In greater detail, the losses are particularly high in the case of the transverse magnetic (TM) electromagnetic modes, since the electromagnetic fields associated thereto are less confined and hence extend further within the semiconductor material.

The aforementioned losses are generally acceptable in the case of applications of a telecommunications type, which typically make use of just transverse electric (TE) modes and use relatively short guide lengths (just a few millimetres), but may prove problematical in the case where the devices in question function as sensors and hence make use of both TE modes and TM modes, as well as of waveguides of some centimetres.

Current SOI optoelectronic devices hence present a behaviour that depends upon biasing. In order to obtain a behaviour independent of biasing, it is possible to increase the section of the waveguides in order to render them symmetrical, but this entails an increase in dimensions. In addition, the presence of an oxide layer with a thickness of a few micrometres that extends across the entire wafer represents a problem as regards the thermal dissipation of possible electro-optical components present on the same chip, since it limits the possibility of integrating numerous components (in particular, the laser source and the control electronics) in one and the same die, as well as the possibility of packaging a number of optically active dice. In this connection, packages of the so-called 2.5 D type are known, each of which includes both electronic integrated circuits (EICs) and photonic integrated chips (PICs). Typically, the EIC devices are soldered on corresponding PIC devices by means of copper pillar contacts formed on the front of the EIC device and on the front of the PIC device.

Current optoelectronic devices on SOI wafers are moreover difficult to couple optically with other optoelectronic devices. In fact, in order to enable optical coupling with the outside world, the optoelectronic devices on SOI wafers comprise optical coupling structures, which expand the cross section of the optical beams to be coupled. This operation, however, entails non-negligible coupling losses (3-7 dB).

More in general, SOI technology provides only a low flexibility in the design stage, not simply in the case of active optical devices but also in the case of passive optical devices, these optical devices forming, for example, optical sensors (for example, gyroscopes). In fact, SOI technology does not allow local variation of the thickness of the oxide region (BOX), and hence does not allow implementation, in one and the same die, of dielectric optical guides with different characteristics of confinement of the field.

BRIEF SUMMARY

One or more embodiments of the present disclosure provide an integrated optical device that will overcome at least in part the drawbacks of the prior art. According to the present disclosure an integrated optical device and a related manufacturing process are provided.

BRIEF DESCRIPTION OF THE SEVERAL VIEWS OF THE DRAWINGS

For a better understanding of the present disclosure, preferred embodiments thereof are now described purely by way of non-limiting example, with reference to the attached drawings, wherein:

FIG. 5 is a schematic top plan view of an optical interferometer;

FIGS. 6 and 7 are schematic cross-sectional views of the optical interferometer illustrated in FIG. 5, taken, respectively, along lines cross section VI-VI and VII-VII, represented in FIG. 5;

FIGS. 10 and 11 are schematic cross-sectional views of an optical device, during successive steps of a manufacturing process;

DETAILED DESCRIPTION

Figure 1:
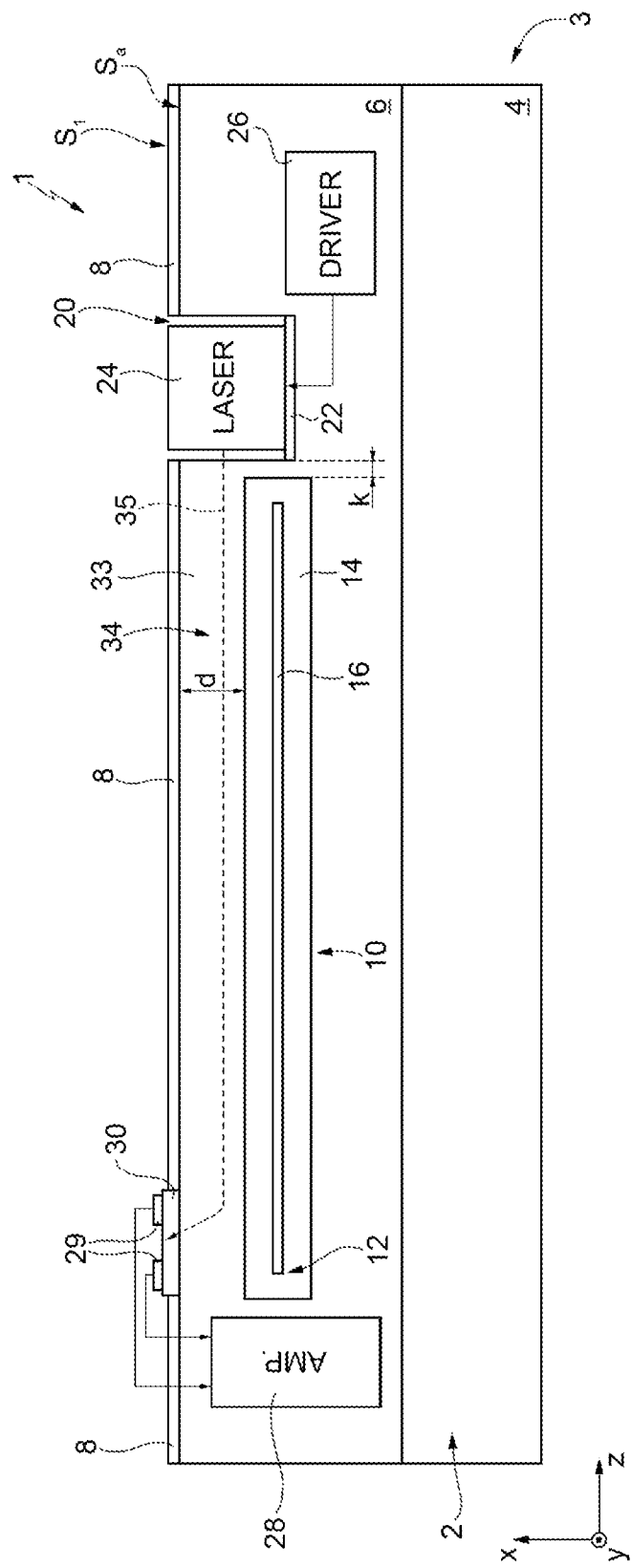
FIGS. 1, 3, 4, 17, and 19 are schematic cross-sectional views, in a first plane, of optoelectronic devices.

FIG. 1 show an optical device 1 of an integrated type, which is formed in a die 3 and comprises a semiconductor body 2, made, for example, of silicon.

Purely by way of example, the semiconductor body 2 comprises a substrate 4 and an overlying epitaxial region 6, which is not described in detail and may include, in a way in itself known, one or more epitaxial layers. Moreover, the epitaxial region 6 forms a top surface $S_a$, which delimits the semiconductor body 2 at the top.

The optical device 1 further comprises a front dielectric layer 8, which extends on the top surface $S_a$ and is in turn delimited at the top by a front surface $S_1$. For instance, the front dielectric layer 8 is made of thermal silicon oxide ($SiO_2$) and has a thickness of between 0.5 µm and 2 µm.

The optical device 1 moreover includes a buried structure 10, which fills a buried cavity 12 that extends within the epitaxial region 6, at a distance from the substrate 4 and from the top surface $S_a$.

For instance, the buried cavity 12 has to a first approximation the shape of a parallelepiped with longitudinal axis parallel to the axis z of an orthogonal reference system xyz arranged so that the top surface $S_a$ is parallel to the plane yz.

The buried structure 10 comprises an outer region 14, which coats all the walls of the buried cavity 12 with a roughly constant thickness, and an inner region 16, which extends at a distance from the walls of the buried cavity 12 so as to be entirely coated by the outer region 14. For instance, also the inner region 16 may have, to a first approximation, the shape of a parallelepiped with longitudinal axis parallel to the axis z.

The outer region 14 may be made of thermal oxide; the inner region 16 may be made of TEOS oxide and performs the function of reducing the mechanical stresses within the buried structure 10.

The top surface $S_a$ and the top wall of the buried cavity 12 are at a distance d from one another, which is comprised, for example, between 200 nm and 400 nm. In greater detail, a top of the buried cavity 12 delimits a bottom of a portion of the epitaxial region 6, designated by 33, referred to in what follows as the front semiconductor region 33.

For practical purposes, the front semiconductor region 33, the overlying portion of front dielectric layer 8, and the underlying buried structure 10, and in particular the portion of outer region 14 that coats the top wall of the buried cavity 12, form a waveguide 34, as explained in greater detail hereinafter.

Figure 2A:
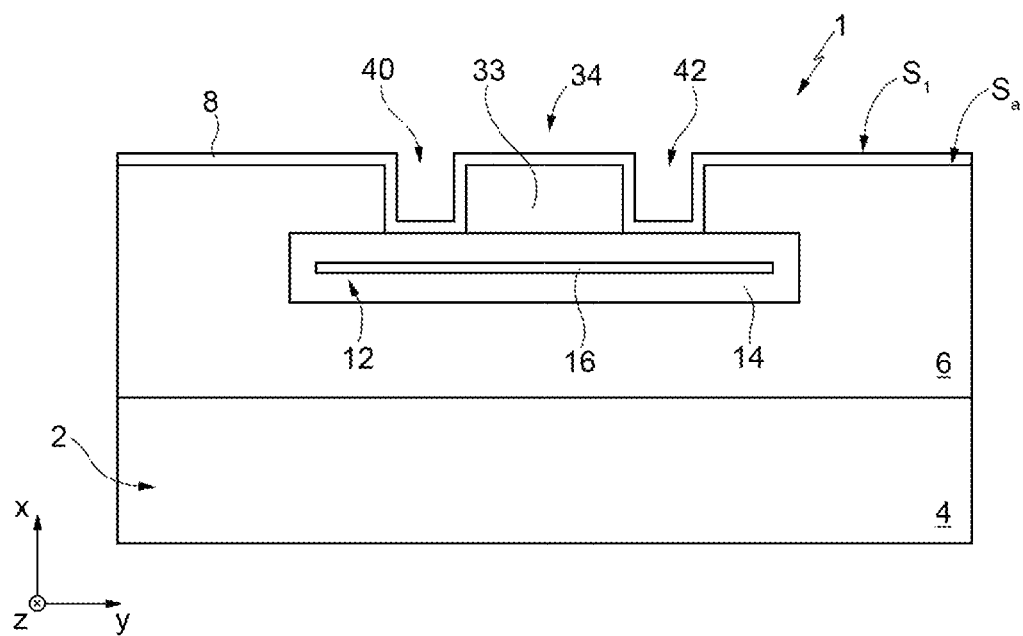
FIGS. 2A and 2B show cross sections, in a second plane perpendicular to the first plane, of optoelectronic devices.

As illustrated in FIG. 2A, in a section parallel to the plane xy, the front semiconductor region 33 may have a rectangular shape, in which case the waveguide 34 is of the strip type. In this case, a first lateral cavity 40 and a second lateral cavity 42 extend in the epitaxial region 6, starting from the top surface $S_a$, up to the buried structure 10.

The first and second lateral cavities 40, 42 extend parallel to the axis z, are arranged in a symmetrical manner with respect to the front semiconductor region 33 and have a rectangular section, in a plane parallel to the plane xy. Moreover, the bottoms of first and second lateral cavities 40, 42 are delimited by the outer region 14 of the buried structure 10; each one of the first and second lateral cavities 40, 42 moreover has a respective side wall, which is formed by the front semiconductor region 33. The side walls and the bottom of each of the first and second lateral cavities 40, 42 are coated with the front dielectric layer 8.

Figure 2B:
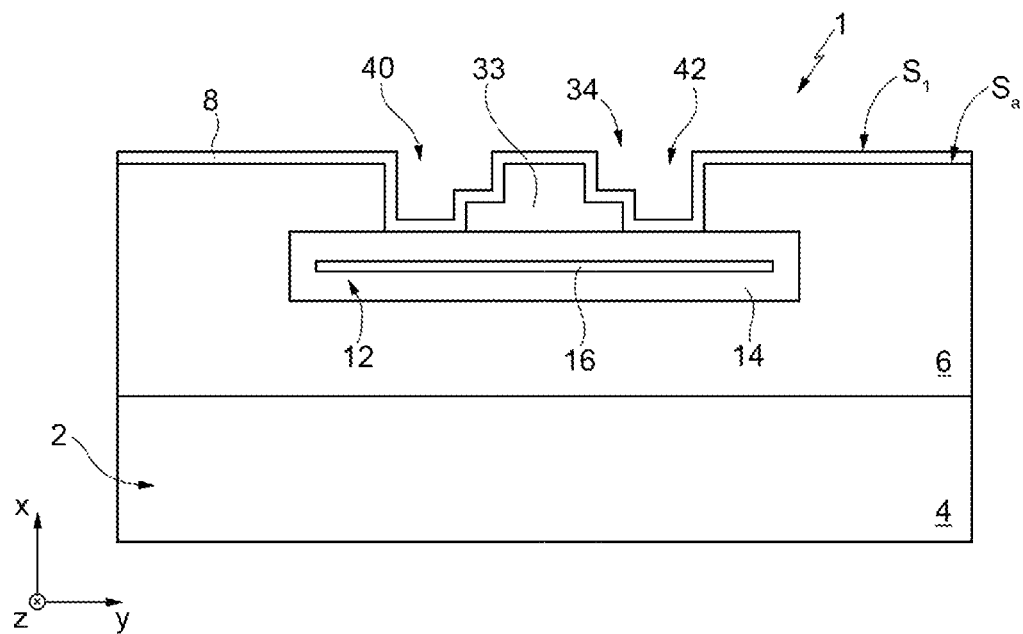

Alternatively, and once again purely by way of example, the waveguide 34 may be of the ridge type, as illustrated in FIG. 2B. In this case, the sections in a plane parallel to the plane xy of the first and second lateral cavities 40, 42 are each delimited laterally by a respective distal wall, formed by the epitaxial region 6 and having a vertical, planar profile, and by a respective proximal wall, formed by the front semiconductor region 33 and having a step-like profile. In other words, in a plane parallel to the plane xy, the front semiconductor region 33 has the shape of a T turned upside down.

As shown in FIG. 1, the optical device 1 further comprises a recess 20, which has, for example, a parallelepipedal shape and extends, starting from the front surface $S_1$, through the front dielectric layer 8 and part of the epitaxial region 6. On the bottom of the recess 20, in contact with the epitaxial region 6, a conductive structure 22 is present.

In greater detail, in a direction parallel to the axis z, the recess 20 is laterally offset with respect to the buried cavity 12 so that it can extend in the semiconductor body 2 down to a depth greater than the depth to which the top wall of the buried cavity 12 extends. Without this implying any loss of generality, in FIG. 1 the recess 20 extends down to a maximum depth comprised between the depths to which the top wall and the bottom wall of the buried cavity 12 extend. Moreover, the recess 20 is located at a distance k (measured parallel to the axis z) from the buried cavity 12, for example of between 0.5 µm and 2 µm.

The optical device 1 further comprises an optical source 24, formed, for example, by a laser diode, for instance of a bare-chip type, i.e., without a package. The optical source 24 is arranged within the recess 20 and is soldered to the conductive structure 22.

The optical device 1 further comprises a driver circuit 26 and an amplifier circuit 28, formed, for example using the so-called CMOS or BCD technology, in the epitaxial region 6.

In detail, the driver circuit 26 is electrically coupled to the conductive structure 22, which enables the driver circuit 26 to control the optical source 24 in a way in itself known. Moreover, the optical source 24 is configured to emit an optical beam 35 (for example, in the infrared, typically between 1200 nm and 1700 nm, but in general up to approximately 7 µm), directing it into the front semiconductor region 33 so that it will propagate in a guided way within the waveguide 34. Consequently, present within the portions of the front dielectric layer 8 and of the buried structure 10 that contact the front semiconductor region 33 is an evanescent field.

The optical device 1 further comprises a detector 30, arranged on the top surface $S_a$ so as to traverse the front dielectric layer 8 and contact the front semiconductor region 33. The detector 30 thus overlies, at a distance, a part of the buried structure 10.

In particular, in a direction parallel to the axis z, the detector 30 is arranged approximately above a first end of the front semiconductor region 33, whereas the optical source 24 gives out onto a second end of the front semiconductor region 33, in which it directs the optical beam 35, which thus propagates from the first end to the second end of the front semiconductor region 33, where it is received by the detector 30.

Albeit not shown, the detector 30 may be made of a semiconductor material different from the material of the semiconductor body 2. For instance, the detector 30 may be made germanium (or an III-V semiconductor, or a corresponding alloy), with a refractive index higher than the refractive index of the semiconductor material. In this case, the detector 30 functions as waveguide, with a length, parallel to the axis z, for example of between 4 µm and 20 µm. This waveguide is optically coupled to the waveguide 34 so that the detector 30 can extract the optical beam 35 from the waveguide 34. The detector 30 is hence able to generate a current proportional to the intensity of the optical beam 35.

Without this implying any loss of generality, the amplifier circuit 28 is formed in a portion of the epitaxial region 6 arranged laterally with respect to the buried cavity 12. Moreover, the amplifier circuit 28 may be formed so that, to a first approximation, the buried cavity 12 and the optical source 24 are interposed, parallel to the axis z, between the amplifier circuit 28 and the driver circuit 26.

The amplifier circuit 28 is electrically connected to the detector 30, for example through a pair of conductive pads 29, arranged on the detector 30. In this way, the current generated by the detector 30 is received by the amplifier circuit 28, which may form, for example, a transimpedance amplifier, in which case it generates a voltage directly proportional to the current.

Purely by way of example, the optical device 1 may function as sensor, on the hypothesis where, for example, it is configured so that the propagation of the optical beam 35 in the front semiconductor region 33 depends upon the concentration of a chemical species to be detected, arranged in the proximity of the front dielectric layer 8.

Irrespective of the type of application, the optical device 1 is characterized by a good confinement of the optical beam 35 within the front semiconductor region 33 and by the propagation of the tail of the field within the buried cavity 12. Moreover, the optical source 24 and the integrated electronics, i.e., the driver circuit 26 and the amplifier circuit 28, can dissipate heat in an optimal way, since they are laterally offset with respect to the buried structure 10, which is made of dielectric material, and is hence thermally insulating. In fact, the optical source 24 and the integrated electronics contact portions of semiconductor material, which is thermally conductive and without underlying cavities.

Figure 3:
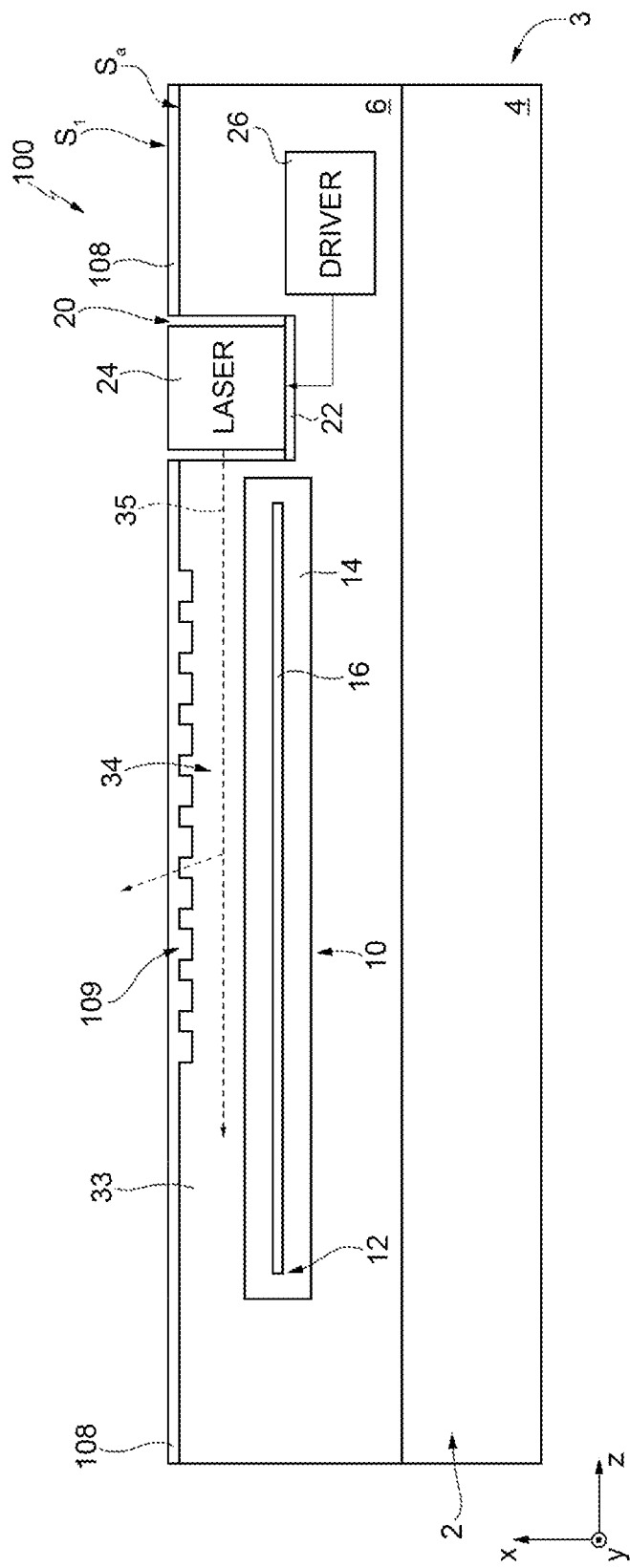

The same advantages are obtained also in the case illustrated in FIG. 3, where the optical device, designated by 100, forms an emitter. In this case, the detector 30 and the amplifier circuit 28 are absent. In addition, the front dielectric layer, here designated by 108, forms a Bragg grating 109, which is arranged on the front semiconductor region 33 and enables extraction from the optical beam 35 of one or more components, directing them towards the outside.

Moreover, possible are variants in which the buried structure 10 is absent, in which case the buried cavity 12 may be empty or else contain one or more gaseous species (for example, an inert gas such as nitrogen). Moreover, it is possible to have embodiments in which the buried structure 10 is without the inner region 16, instead of which an additional cavity is present, which is delimited by the outer region 14 and may be empty or else contain one or more gaseous species (for example, an inert gas such as nitrogen).

Figure 4:
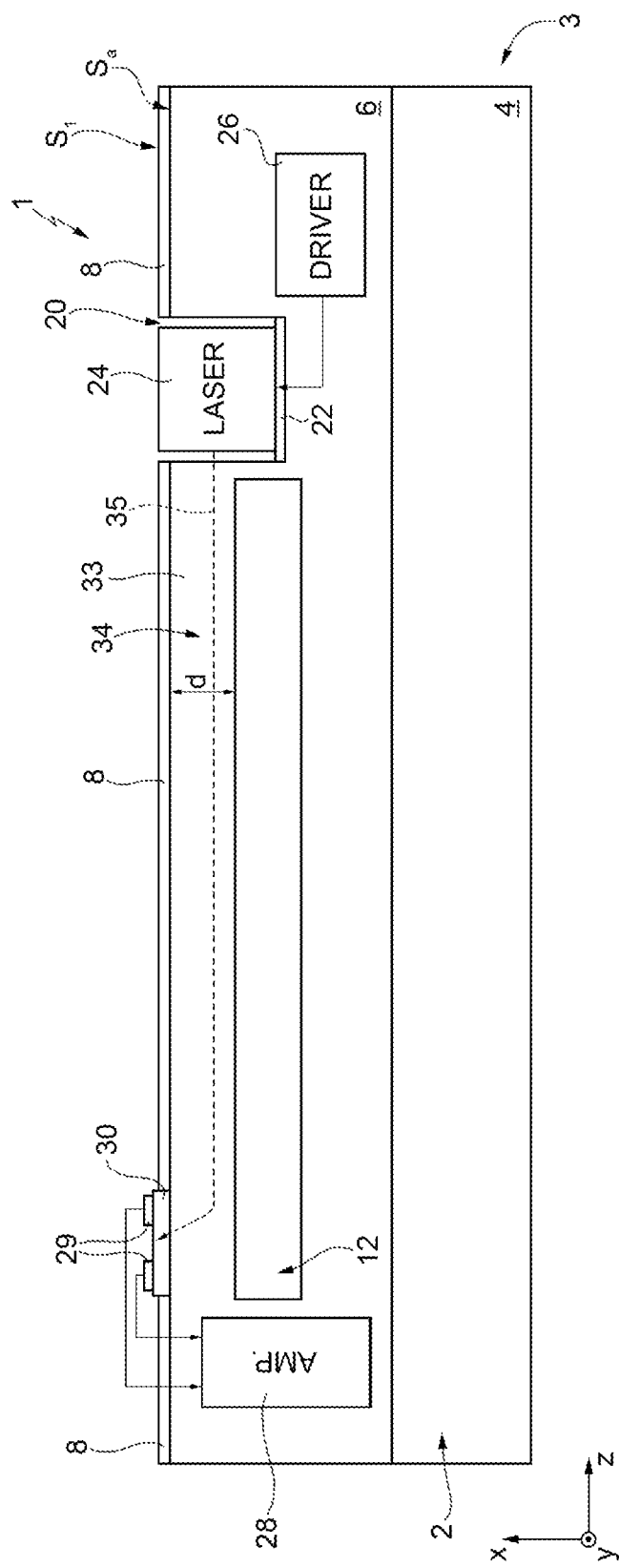

For instance, FIG. 4 shows an embodiment of the same type as the one illustrated in FIG. 1, but in which the buried cavity 12 is empty. In this case, the propagation losses within the optical guide 34 are further reduced as compared to the case illustrated in FIG. 1.

Figure 7:
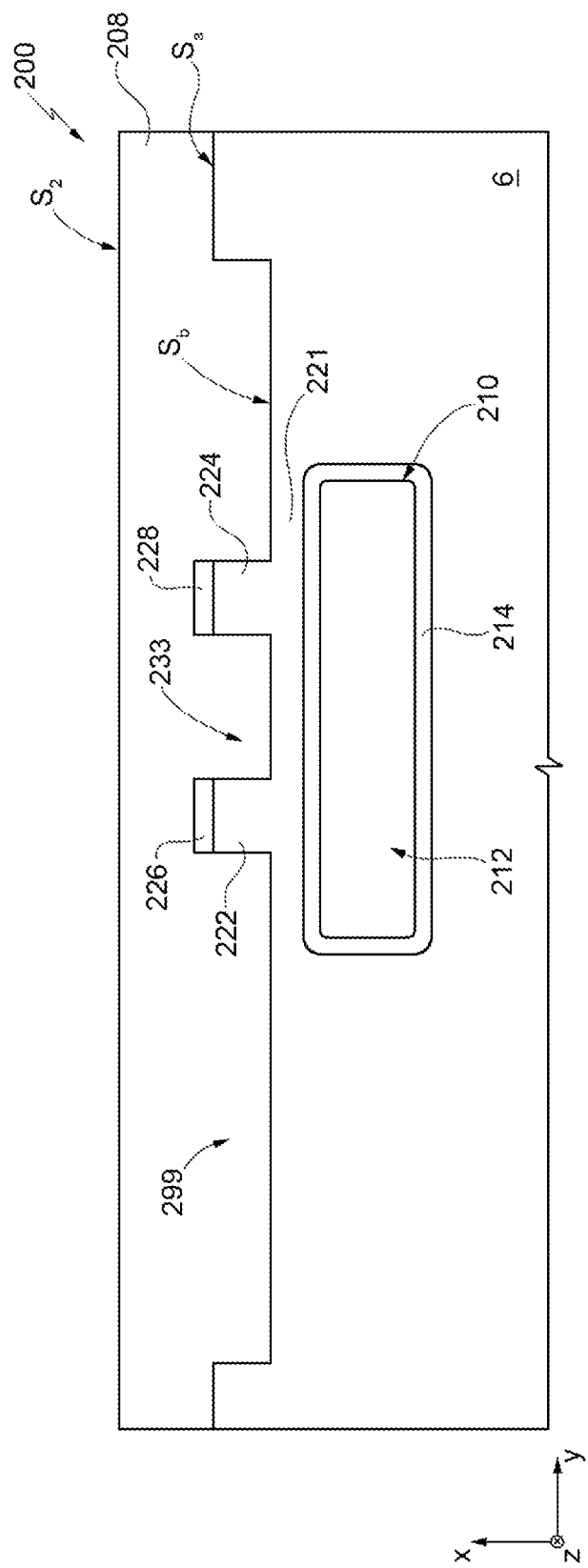

According to an embodiment illustrated in FIGS. 5-7, the optical device forms an interferometer 200 of the Mach-Zehnder type, which is described in what follows limitedly to the differences with respect to the optical device 1 illustrated in FIG. 1.

Present on top of the buried cavity, here designated by 212, is the front semiconductor region, here designated by 233.

The front semiconductor region 233 comprises a base portion 221, which overlies the buried cavity 212, delimiting it at the top. The base portion 221 has a constant thickness and is delimited at the top by a surface $S_b$, referred to in what follows as the lowered surface $S_b$. The lowered surface $S_b$ is located at a height (measured with respect to the axis x) lower than the top surface $S_a$.

The front semiconductor region 233 further comprises a first guide region 222 and a second guide region 224, which overlie the base portion 221, with which they form a monolithic region.

In detail, the first and second guide regions 222, 224 branch-off from the base portion 221 so as to extend between the top surface $S_a$ and the lowered surface $S_b$.

In greater detail, the epitaxial region 6 delimits a recess 299, referred to in what follows as the main recess 299, which extends in the epitaxial region 6 starting from the top surface $S_a$ and is delimited at the bottom by the base portion 221 of the front semiconductor region 233. The first and second guide regions 222, 224 extend within the main recess 299.

In even greater detail, the first and second guide regions 222, 224 have elongated shapes and form corresponding branches of the interferometer 200. For instance, the second guide region 224 may have the shape of an elongated parallelepiped parallel to the axis z. In addition, in top plan view, the first guide region 222 may include a pair of terminal portions, parallel to the second guide region 224, and a central portion, which is interposed between the terminal portions and is approximately C-shaped.

The buried cavity 212 has a shape such that, as mentioned previously, both the first guide region 222 and the second guide region 224 extend, at a distance, entirely over the buried cavity 212. Without this implying any loss of generality, the buried cavity 212 may have, in top plan view, the shape of a trapezium with the major base that lies along a central portion of a side of a rectangle, this side having a length greater than the length of the major base of the trapezium. Moreover, the walls of the buried cavity 212 have rounded corners, as well as being coated with the outer region, here designated by 214 (not illustrated in FIG. 5, for simplicity); the inner region is absent. To a first approximation, the above shape of the buried cavity 212 is invariant in regard to translations along the axis x.

Once again without this implying any loss of generality, in top plan view the main recess 299 may have a rectangular shape, which overlies entirely the buried cavity 212.

Arranged on top of the first and second guide regions 222, 224, in direct contact therewith, are a first contact region 226 and a second contact region 228 respectively, made of conductive material (for example, gold).

Extending over the first and second contact regions 226, 228 and the portions of epitaxial region 6 left exposed by the first and second guide regions 222, 224 is a front dielectric region 208, which is made, for example, of thermal silicon oxide and is delimited at the top by a surface $S_2$, referred to in what follows as the dielectric surface $S_2$. The front dielectric region 208 moreover coats the side walls of the first and second guide regions 222, 224 so as to form, together with the first and second contact regions 226, 228, structures adapted to confine electromagnetic fields that propagate in the first and second guide regions 222, 224 at the top and laterally.

Extending on the dielectric surface $S_2$ is a resistor 240, which has a serpentine shape and the envelope of which extends, for example, parallel to the axis z, so as to overlie, at a distance, the aforementioned central portion of the first guide region 222. The resistor 240 is moreover laterally offset with respect to the second guide region 224.

Likewise, a control circuit 250 is present in the die 3 (illustrated qualitatively in just FIG. 5), hence an active electrical component, which is electrically coupled to the resistor 240 so as to inject a current into the resistor 240, thus causing heating of the first guide region 222, but not of the second guide region 224. In a way in itself known, the selective variation in temperature between the first and second branches of the interferometer 200 enables switching between different operating modes of the interferometer 200.

In greater detail, the control circuit 250 is formed in a portion of epitaxial region 6 laterally offset with respect to the buried cavity 212. This offsetting with respect to the buried cavity 212 guarantees optimal thermal dissipation, thanks to the possibility of thermally coupling the control circuit 250 to underlying portions of semiconductor material. Instead, the presence, underneath the resistor 240, of the buried cavity 212 enables minimization of the fraction of heat dissipated by the substrate, guaranteeing proper operation of the latter at the minimum electrical power supplied by the control circuit 250. In this connection, albeit not shown, the first and second contact regions 226, 228 are electrically coupled to the control circuit 250, which can impose corresponding voltages, so that the interferometer 200 will operate, for example, as a modulator. This modulator can be coupled, in a way in itself known, to an optical generator (not illustrated).

Once again with reference to FIGS. 5-7, the first and second guide regions 222, 224 form the cores of corresponding waveguides, as mentioned previously. In this connection, the top wall of the buried cavity 212 functions as structure adapted to confine underneath the electromagnetic fields that propagate in the first and second guide regions 222, 224 and in the underlying parts of the base portion 221. Moreover, to a first approximation, it may be assumed that there is no guided propagation within the parts of the base portion 221 laterally offset with respect to the first and second guide regions 222, 224, in particular in the case where the base portion 221 has a thickness that is negligible with respect to the thickness of the first and second guide regions 222, 224.

Figure 9:
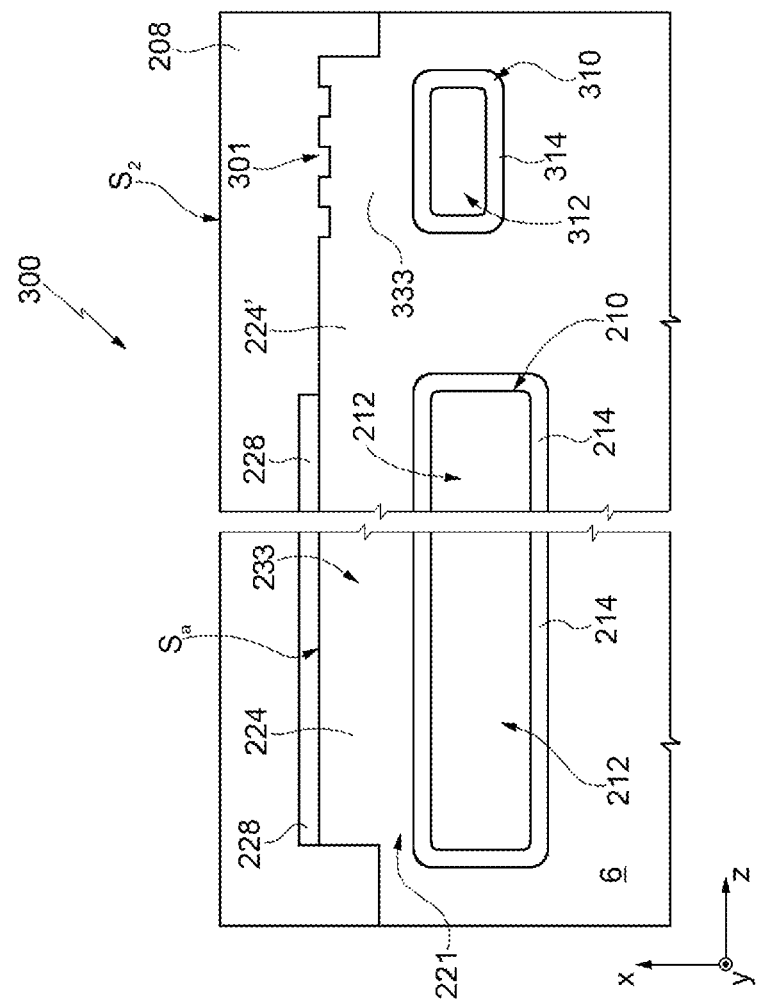
FIG. 9 is a schematic cross-sectional view of the optical device illustrated in FIG. 8, taken along a line of section IX-IX represented in FIG. 8.
Figure 8:
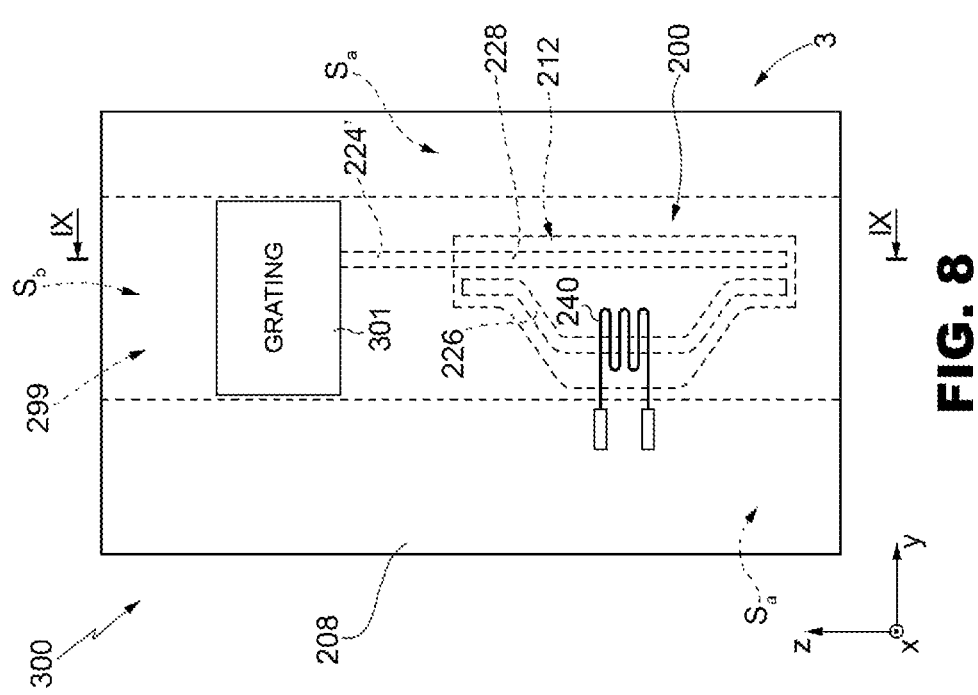
FIG. 8 is a schematic top plan view of an optical interferometer.

FIGS. 8 and 9 show a further embodiment, in which the die 3 is without active components, whether electrical or optical. This embodiment is now described limitedly to the differences with respect to the embodiment illustrated in FIGS. 5-7.

In detail, the optical device, here designated by 300, is without the control circuit 250. Consequently, in use, the resistor 240 is electrically coupled to a corresponding electronic circuit (not illustrated) arranged on the outside of the die 3.

In the die 3, in addition to the interferometer 200, an additional optical component of an integrated type is present, such as a grating coupler 301, which in FIG. 8 is illustrated only qualitatively.

As shown in FIG. 9, present in the epitaxial region 6 is an additional buried cavity 312, laterally offset with respect to the buried cavity 212. Purely by way of example, in top plan view the additional buried cavity 312 has a quadrangular shape. Moreover, the additional buried cavity 312 delimits at the bottom a corresponding portion of the epitaxial region 6, referred to in what follows as the additional front semiconductor region 333, which is laterally offset with respect to the front semiconductor region 233.

Without this implying any loss of generality, present in the additional buried cavity 312 is an additional buried structure 310, which comprises a respective outer region 314.

The front dielectric region 208 overlies, in direct contact, the additional front semiconductor region 333, which is shaped at the top so as to form the aforementioned grating coupler 301. Moreover, in a direction parallel to the axis x, the portions with greater height of the additional front semiconductor region 333 extend up to the top surface $S_a$.

The top wall of the additional buried cavity 312 extends at the same height as the top wall of the buried cavity 212. Without this implying any loss of generality, the additional buried cavity 312 has a height, parallel to the axis x, lower than the height of the buried cavity 212.

In use, the grating coupler 301 can be optically coupled to an optical fiber (not illustrated), so as to receive radiation coming from the optical fiber, couple it in the additional front semiconductor region 333, and direct it towards the interferometer 200. For this purpose, the front semiconductor region 233 includes a connecting semiconductor region 224', which is interposed between the grating coupler 301 and the second guide region 224 and forms a prolongation, having the same section (in a plane parallel to the plane xy) as the second guide region 224, so as to connect the latter optically to the grating coupler 301. The additional front semiconductor region 333 hence functions as corresponding waveguide for the radiation coming from the optical fiber.

In general, the length, parallel to the axis z, of the connecting semiconductor region 224', and hence also the distance, parallel to the axis z, between the buried cavity 212 and the additional buried cavity 312 may be very limited (ideally zero), for example not greater than 300 nm.

In practice, the buried cavity 212 and the additional buried cavity 312 extend to different depths, so as to optimize, independently, the optical characteristics of the optical components formed thereby. In particular, the reduced height (for example, of between 700 nm and 800 nm) of the additional buried cavity 312 enables phasing of the electromagnetic field coming from the fiber and reflected by the outer region 314 with the electromagnetic field that impinges upon the grating coupler 301, thus reducing the coupling losses with the optical fiber.

The present optical device can be manufactured as described in what follows, with reference, purely by way of example, to the optical device 1 illustrated in FIG. 1, but where the buried cavity 12 is empty.

As shown in FIG. 10, the semiconductor body 2, which forms part of a silicon wafer 500, which is delimited at the top by a wafer surface $S_{500}$ is initially formed.

Figure 11:
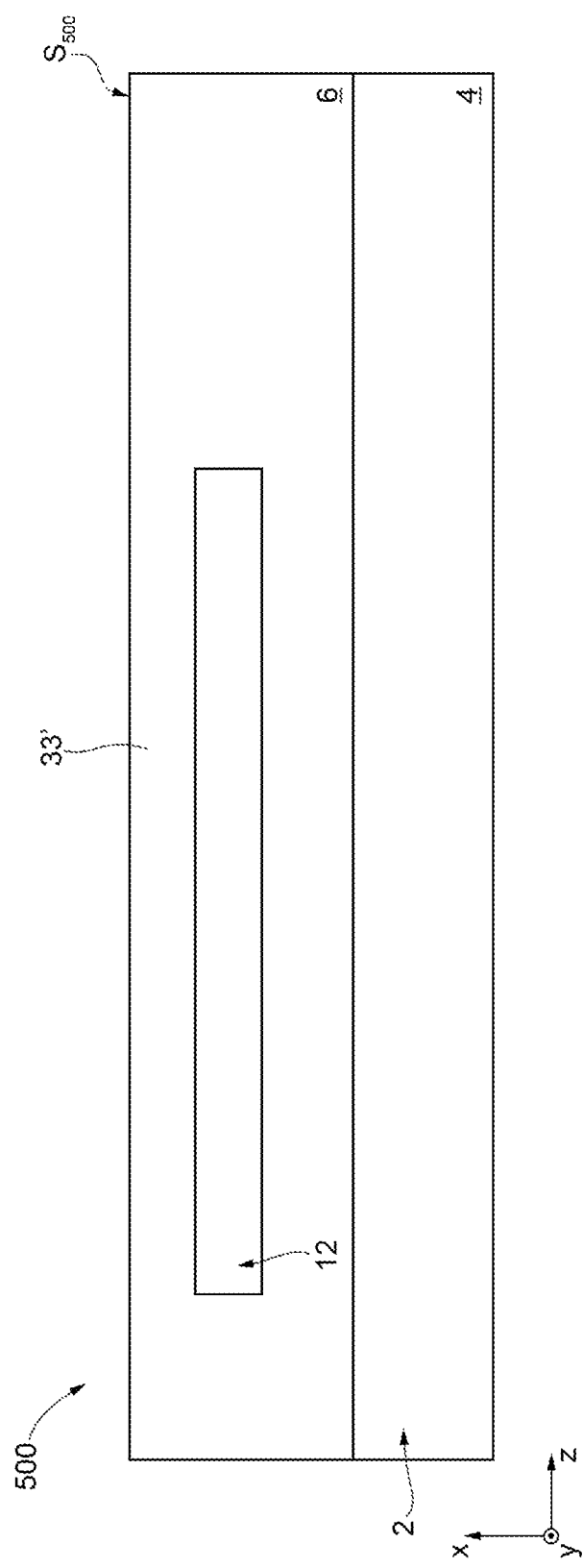

Next, as illustrated in FIG. 11, the wafer 500 is processed so as to form the buried cavity 12. Formation of the buried cavity 12 may be obtained in various ways, for example as taught in the U.S. Pat. No. 8,173,513, which is incorporated by reference herein in its entirety. In this case, even though not shown, deep trenches are initially formed, separated by silicon columns. Then, an epitaxial growth is carried out in a deoxidizing environment so as to grow, on the silicon columns, an epitaxial layer that closes the trenches at the top, trapping therein the gas present. Next, a thermal annealing is carried out, which causes migration of the silicon atoms and formation of an empty buried cavity (except for possible residual gases), which delimits at the bottom a suspended region 33', i.e., a membrane, which will form the front semiconductor region 33.

Alternatively, the buried cavity 12 may be formed using the process described in S. Armbruster, et al. "A novel micromachining process for the fabrication of monocrystalline Si-membranes using porous silicon", TRANSDUCERS'03, The 12th International Conference on Solid-State Sensors, Actuators and Microsystems, BOSTON, Jun. 8-12, 2003, vol. 1, pp. 246-249. Also this process enables formation of the front semiconductor region 33 so that it will have a contained roughness, and hence a good optical behavior.

Next, the optical device 1, and hence, among other things, the driver circuit 26 and the amplifier circuit 28, is formed in a way in itself known and not illustrated herein. These subsequent operations further comprise etching operations that enable patterning of the suspended membrane 33' so that the remaining portion will form the front semiconductor region 33.

As regards the embodiments with a number of buried cavities, the latter may be formed as described previously with reference to the buried cavity 12, simultaneously. In particular, the buried cavities may be formed with different depths, heights, and shapes, for example, by adopting a corresponding arrangement of the aforementioned initial deep trenches.

Figure 12:
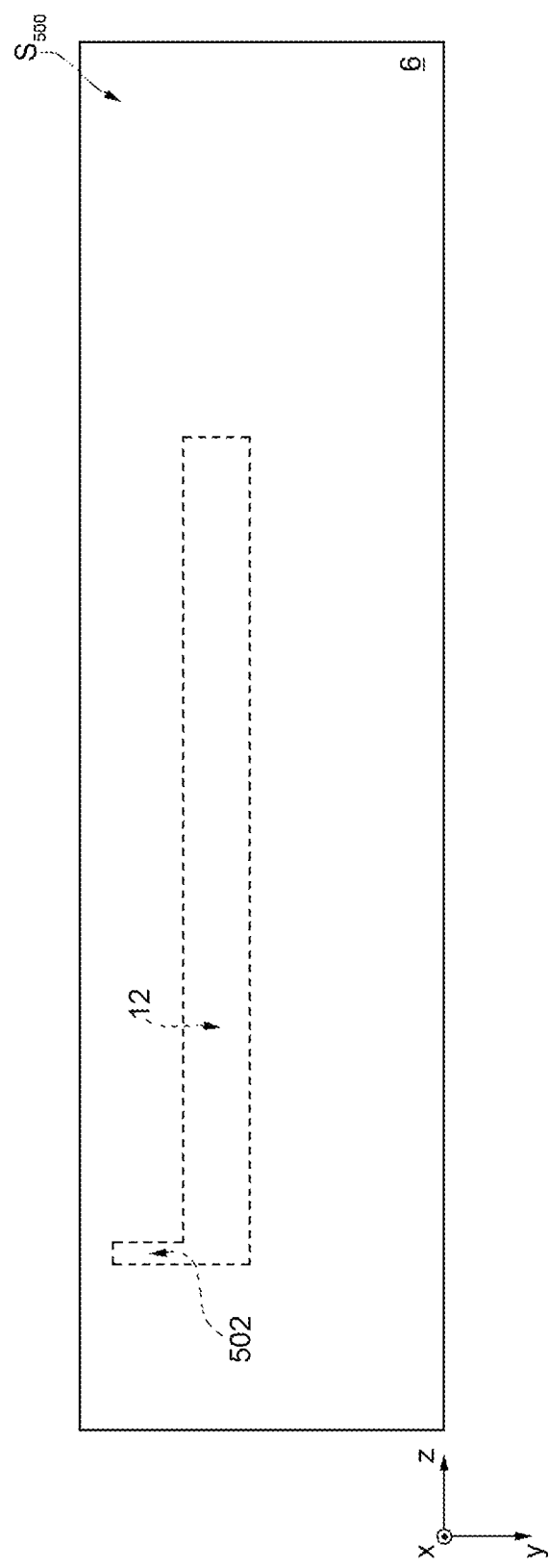
FIGS. 12 and 13 are, respectively, a schematic top plan view and a cross section of the optical device, during one and the same step of the manufacturing process.
Figure 13:
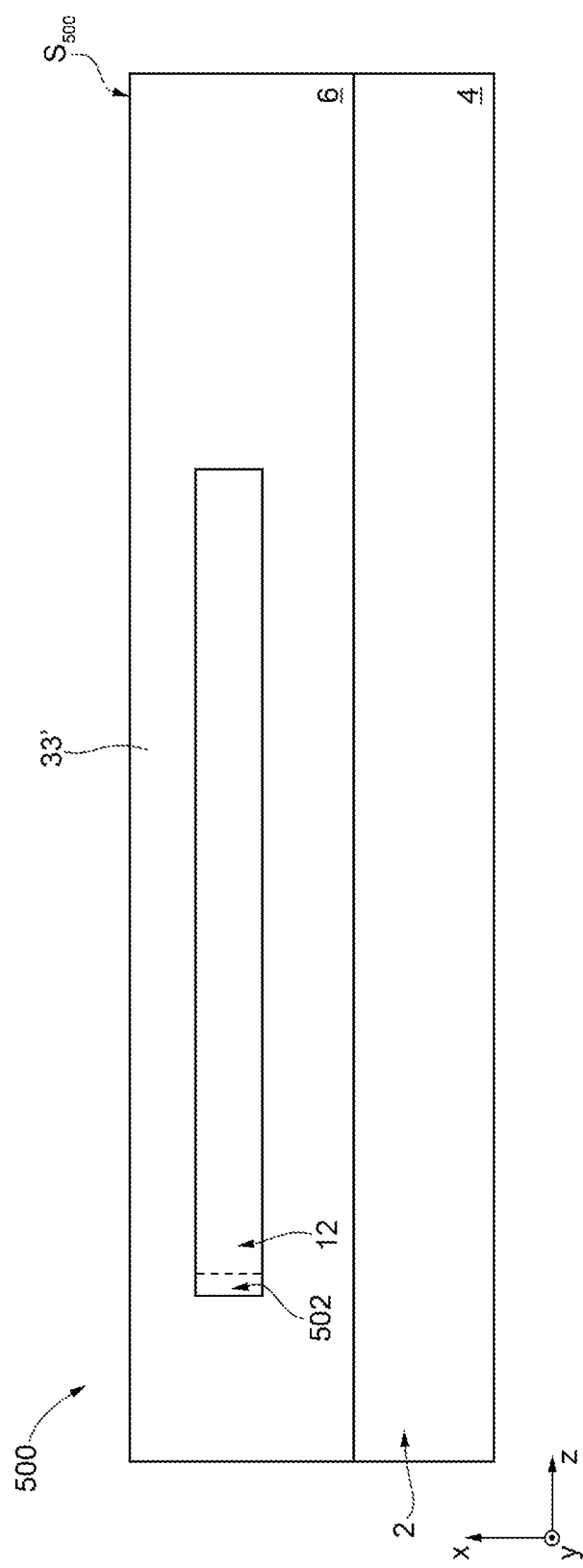

In the case where the optical device also comprises the buried structure 10, the latter may be formed in a way in itself known. For instance, as shown in FIGS. 12 and 13, simultaneously with the buried cavity 12, and using the same process, a horizontal channel 502 is also formed, fluidically coupled to the buried cavity 12 and extending from a side wall of the buried cavity 12, parallel to the axis y. For instance, the horizontal channel 502 has the same thickness as the buried cavity 12 and extends from one of the two side walls arranged in a direction perpendicular to the axis y.

In greater detail, the cavity formed as a whole by the horizontal channel 502 and by the buried cavity 12 may be obtained by adopting an appropriate distribution of the aforementioned initial deep trenches, which have different depths.

Figure 14:
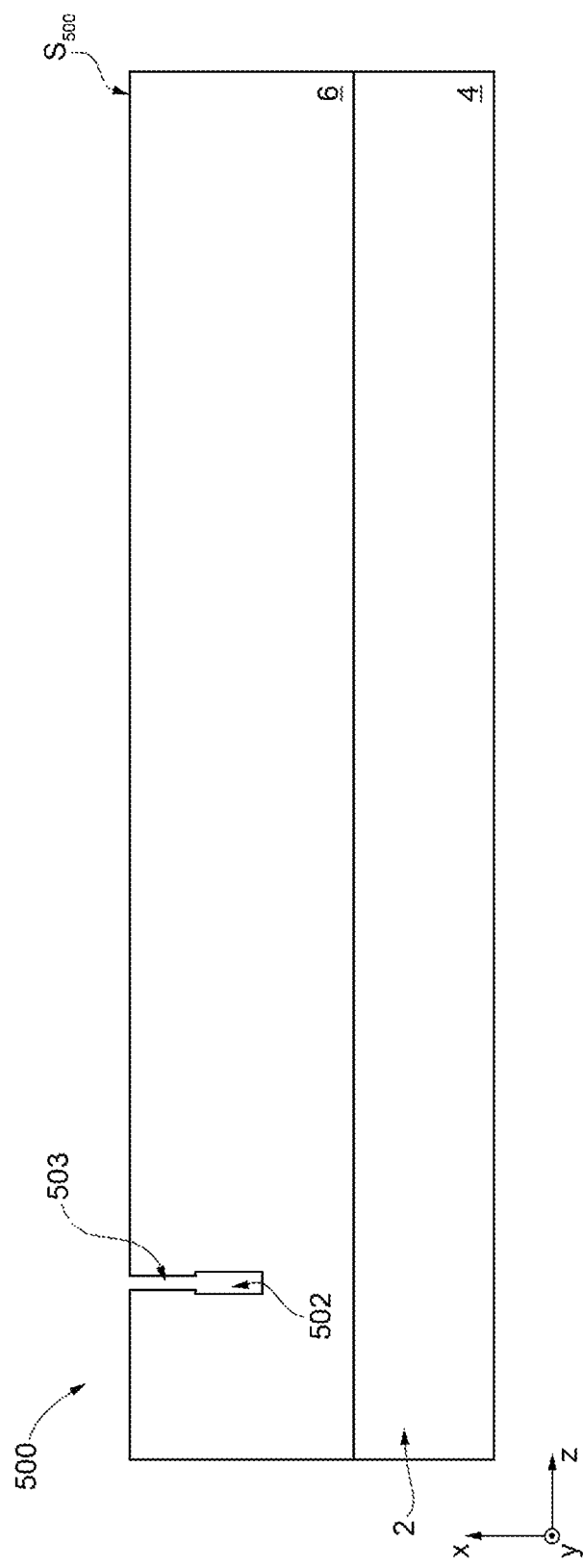
FIGS. 14 and 15 are schematic cross-sectional views (taken in parallel, but different, planes) of the optical device during successive steps of the manufacturing process.

Next, as illustrated in FIG. 14, a portion of the epitaxial region 6 arranged on top of the horizontal channel 502 is selectively removed, for example by means of a dry etch. In this way, a vertical channel 503 is formed, which is laterally offset with respect to the buried cavity 12 and is fluidically coupled to the latter, through the horizontal channel 502.

Figure 15:
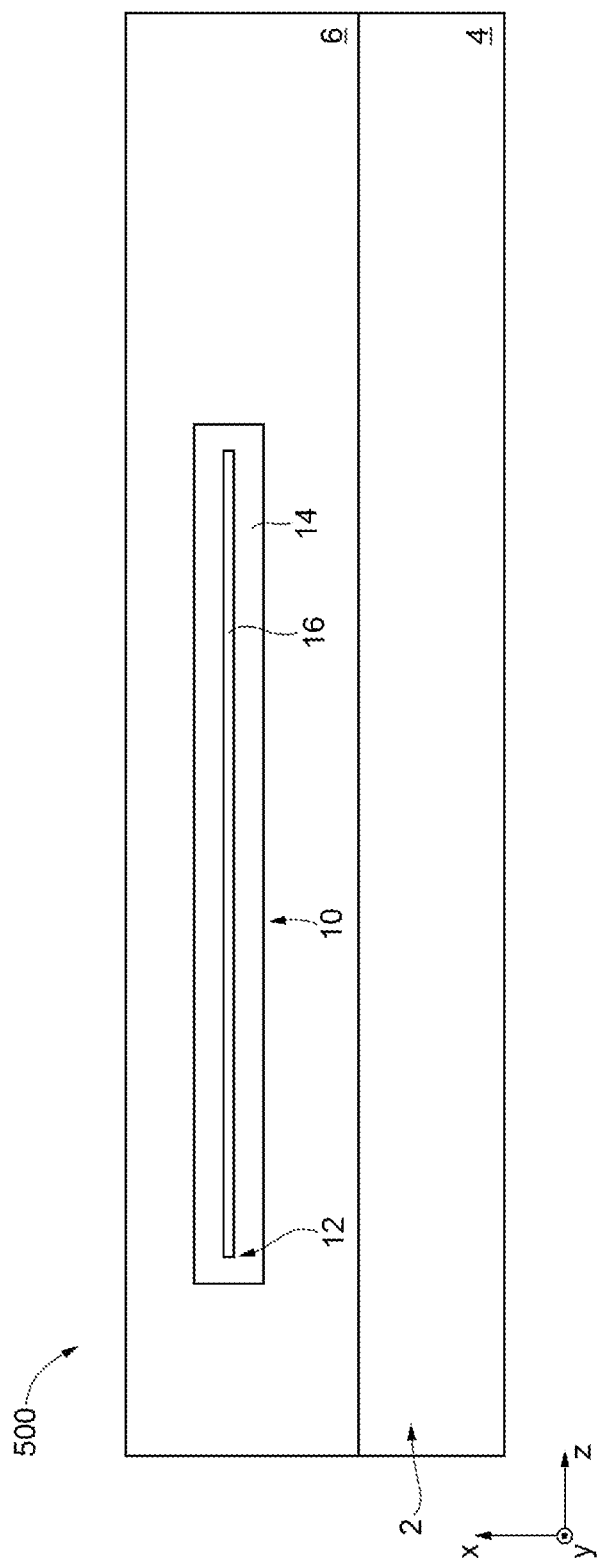
Figure 16:
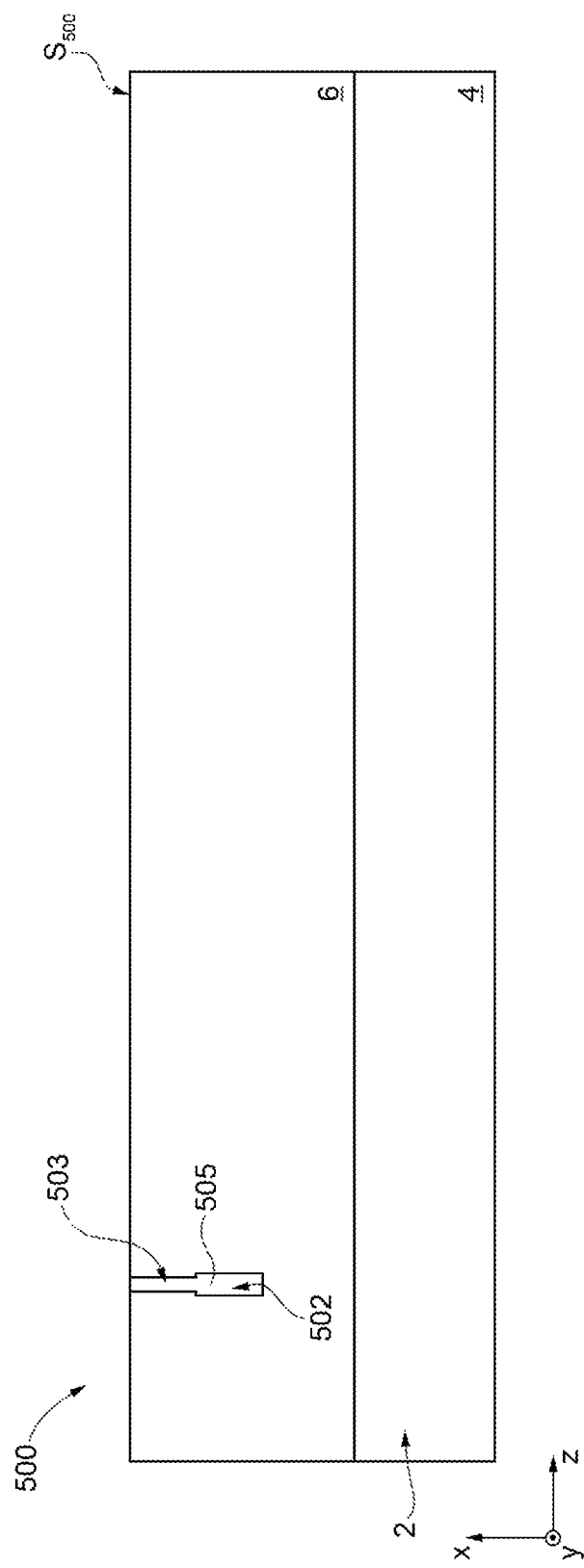
FIG. 16 is a schematic cross-sectional view of the optical device, taken in the same plane as that of FIG. 14 and regarding the same step as that of FIG. 15.

Then, as shown in FIG. 15, the outer region 14 and the inner region 16 of the buried structure 10 are formed. In particular, through the vertical channel 503 and the horizontal channel 502 an oxidizing gas (for example, oxygen or water vapor) is introduced into the buried cavity 12, and a thermal treatment is carried out so as to form the outer region 14. Next, through the vertical channel 503 and the horizontal channel 502 TEOS oxide is introduced into the aforementioned overall cavity so as to form the inner region 16 and occlude the vertical channel 503 and the horizontal channel 502 by means of a closing region 505 (visible in FIG. 16). In this connection, for simplicity, the closing region 505 has not been illustrated in any of FIGS. 1-9.

The advantages that the present optical device affords emerge clearly from the foregoing description.

In particular, the present device does not have a single dielectric layer, arranged uniformly underneath a semiconductor region, but rather has a cavity, possibly filled either totally or partially with dielectric material, which is arranged so as to form at least one corresponding waveguide and is laterally offset with respect to possible active optical and/or electrical components integrated in the device, and/or with respect to at least one further buried cavity, which forms a different optical guide. In other words, the buried cavity forms a field-confinement region, which has a width and a length, measured along the axes x and y, respectively, smaller than the width and the length of the die, so that portions of die exist that are laterally offset with respect to the buried cavity, which can house active electrical/optical components and/or optical components that include optical guides with cores that have different thicknesses.

Finally, it is clear that modifications and variations may be made to the present optical device and to the related manufacturing process, without thereby departing from the sphere of protection of the present disclosure.

For instance, embodiments are possible of the type illustrated in FIGS. 5-7, but where the first contact region 226 and the resistor 240 are absent. Moreover, the second contact region 228 forms a high-resistance contact. In this case, the interferometer 200 functions as a tunable optical filter that can be controlled through the second contact region 228.

The buried structure may be different from what has been described; for example, the outer region may coat only part of the walls of the buried cavity.

Figure 17:
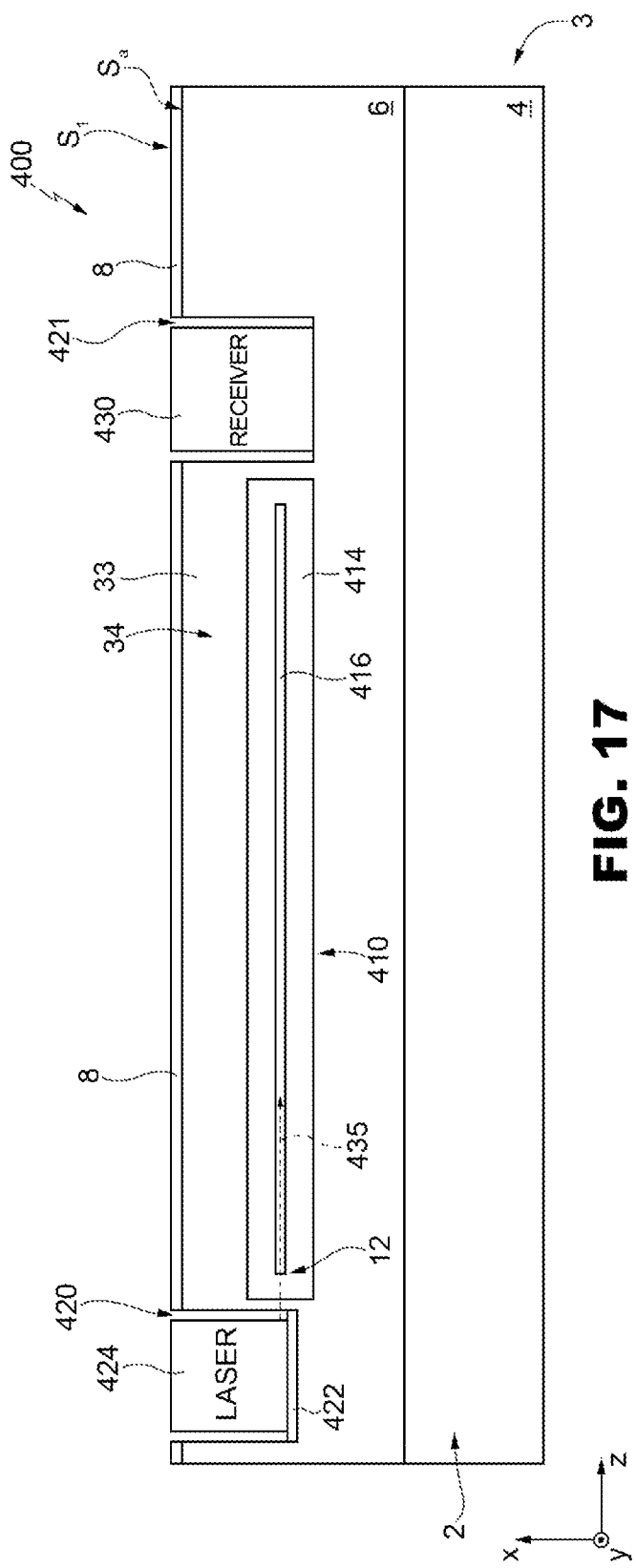
Figure 18:
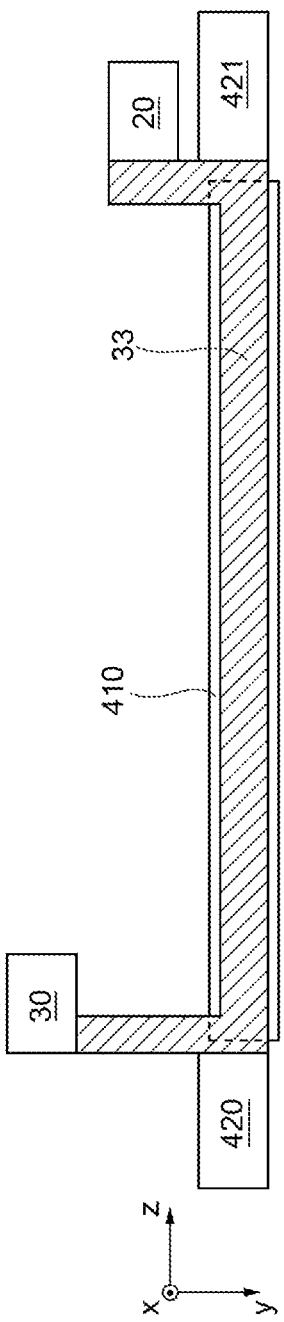
FIG. 18 is a schematic top plan view, with portions removed, of the embodiment illustrated in FIG. 17.

Moreover, an embodiment of the type illustrated in FIGS. 17 and 18 is possible, which is the same as that shown in FIG. 1, except for the differences described in what follows.

The optical device, here designated by 400, comprises a first additional recess 420 and a second additional recess 421, each of which has, for example, a parallelepipedal shape and extends, starting from the front surface $S_1$, through the front dielectric layer 108 and part of the epitaxial region 6. In FIG. 17, among other things, the optical source 24 and the detector 30 are not visible since FIG. 17 regards a cross section different from the one shown in FIG. 1. In addition, without this implying any loss of generality, the shape of the front semiconductor region 33 is different from what is shown in FIG. 1. As illustrated in FIG. 18, the front semiconductor region 33 is, in top plan view, shaped like a squared C, so that only part of its central portion overlies the buried cavity 12, whereas the two terminal portions, which are optically coupled, respectively, to the optical source 24 and to the detector 30, are laterally offset with respect to the underlying buried cavity 12.

This having been said, the buried cavity 12 is interposed between the first and second additional recesses 420, 421; moreover, without this implying any loss of generality, the second additional recess 421 is laterally offset, for example along just the axis y, with respect to the recess 20.

Present on the bottom of the first additional recess 420 are an additional conductive structure 422 and an additional optical source 424, which is formed, for example, by a corresponding laser diode and is soldered to the additional conductive structure 422. Albeit not shown, the optical device 400 further comprises a driver circuit for the additional optical source 424.

The inner region 416 and the outer region 414 of the buried structure 410 are made, respectively, of TEOS oxide and thermal oxide and are such that the refractive index of the inner region 416 is higher than the refractive index of the outer region 414. Consequently, the buried structure 410 forms an additional optical guide. Moreover, the additional optical source 424 is configured to generate a respective optical beam 435, directing it into the buried structure 410 so that it will propagate in a guided way within the inner region 416 and will reach an additional receiver 430, arranged in the second additional recess 421.

The optical beam 435 may have the purpose of transmitting additional optical signals, at the same wavelength as the optical beam 35 or else, for example, in the visible, to be able to use a silicon detector (in this case, the wavelength may extend as far as the near infrared, i.e., as far as approximately 950 nm). In this way, the optical beam 435 forms a sort of service or monitoring channel for the overlying channel.

As mentioned previously, moreover possible are embodiments in which the front semiconductor region has a shape different from what has been described, such as a circular shape (with a length of, for example, a few centimeters), in which case the optical device can function as an optical gyroscope.

Figure 19:
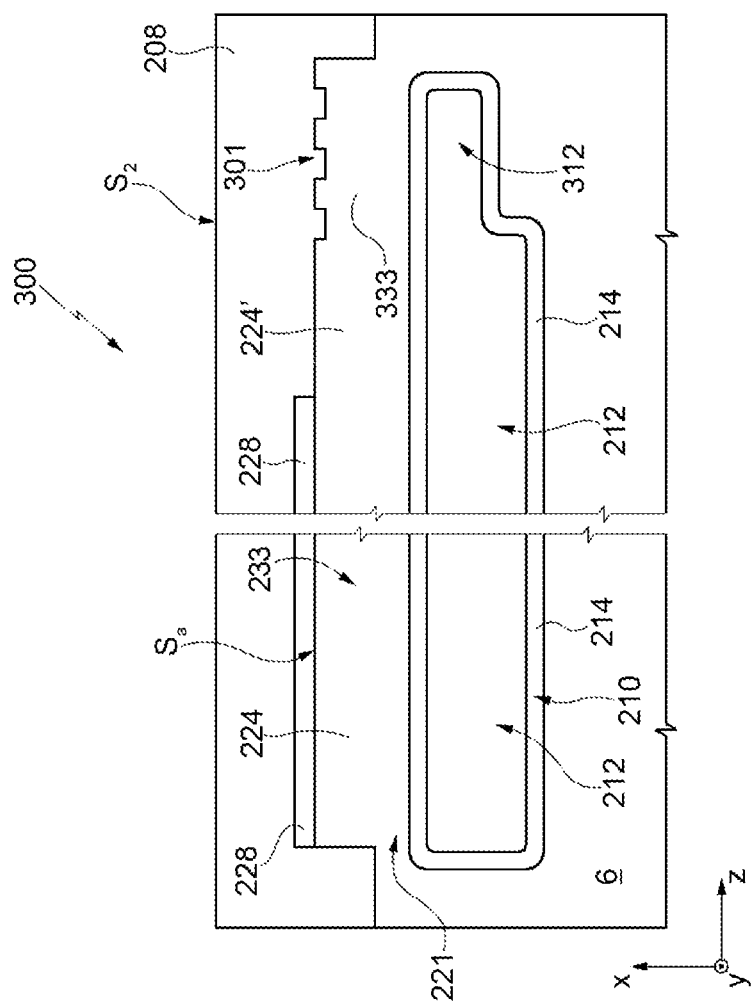

Moreover possible are embodiments of the type illustrated in FIG. 19, where the buried cavity 212 and the additional buried cavity 312 are once again laterally offset, but are in (lateral) communication with one another so as to form a single cavity delimited by a respective top plane wall parallel to the top surface $S_a$ and having two portions with different thicknesses, which may share one and the same outer region, here designated once again by 214.

As regards the manufacturing process, the horizontal channel and the vertical channel, if present, may have different shapes. For instance, the horizontal channel may be C-shaped and may extend from three side walls of the buried cavity. The vertical channel may be replaced by a trench.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated optical device, comprising:
   a semiconductor body delimited by a top surface;
   a first optical guide region that includes a first front semiconductor region of the semiconductor body;
   first and second cavities that are positioned on opposite sides of the first front semiconductor region; and
   a first buried cavity which extends in the semiconductor body, at a distance from the top surface, the first front semiconductor region having a bottom defined at least in part by the first buried cavity.

2. The integrated optical device according to claim 1, further comprising an optical source which extends at least in part in the semiconductor body, is laterally offset with respect to the first buried cavity, and is configured to direct an optical beam into the first front semiconductor region.

3. The integrated optical device according to claim 1, further comprising an electrical circuit integrated in the semiconductor body and laterally offset with respect to the first buried cavity.

4. The integrated optical device according to claim 1, further comprising a buried structure which is arranged in the first buried cavity and comprises a dielectric coating region which coats at least part of an inside of the first buried cavity.

5. The integrated optical device according to claim 4, wherein the buried structure further comprises an internal dielectric region which is coated by the dielectric coating region.

6. The integrated optical device according to claim 5, wherein the internal dielectric region has a refractive index higher than that of the dielectric coating region; said optical device further comprising an optical source which extends at least in part in the semiconductor body, is laterally offset with respect to the first buried cavity and is configured to direct an optical beam into the buried structure, the buried structure being configured to propagate the optical beam in a guided way.

7. The integrated optical device according to claim 1, wherein the first buried cavity is at least partially empty or filled with gaseous material.

8. The integrated optical device according to claim 1, wherein the first front semiconductor region comprises an elongated portion elongated in a direction of elongation which extends parallel to the top surface; said integrated optical device further comprising a confinement structure which, in a plane perpendicular to the direction of elongation, coats top and lateral sides of the elongated portion.

9. The integrated optical device according to claim 1, further comprising a second buried cavity which extends in the semiconductor body at a distance from the top surface and is laterally offset with respect to the first buried cavity, so as to delimit at a bottom of a second front semiconductor region of the semiconductor body, the second front semiconductor region being configured to function as a second optical guide region.

10. The integrated optical device according to claim 9, wherein the first and second buried cavities have different heights so as to form different optical components, said heights being in a direction perpendicular to the top surface $(S_a)$, said first and second buried cavities being laterally offset.

11. The integrated optical device according to claim 1, further comprising:
   a third cavity extending a first distance into the semiconductor body from the top surface, the first buried cavity extending a second distance, which is greater than the first distance, into the semiconductor body from the top surface; and
   an optical source in the third cavity.

12. The integrated optical device according to claim 1, wherein the top surface of the semiconductor body has a grating structure.

13. The integrated optical device according to claim 1, wherein each of the first and second cavities includes a first portion extending a first distance into the semiconductor body from the top surface, and a second portion extending a second distance, which is different than the first distance, into the semiconductor body from the top surface.

14. A process, comprising:
   manufacturing an integrated optical device, the manufacturing including:
      forming a first optical guide region that includes a first front semiconductor region of a semiconductor body;
      first and second cavities that are positioned on opposite sides of the first front semiconductor region; and
      forming, in the semiconductor body delimited by a top surface, a first buried cavity that extends at a distance from the top surface, wherein forming the first buried cavity delimits a bottom of the first front semiconductor region.

15. The process according to claim 14, wherein forming the first buried cavity includes forming the first front semiconductor region as a suspended region over the first buried cavity.

16. The process according to claim 14, further comprising setting an optical source at least partly in the semiconductor body, the optical source being laterally offset with respect to the first buried cavity and configured to direct an optical beam into the first front semiconductor region.

17. The process according to claim 14, further comprising forming an electrical circuit in the semiconductor body, electrical circuit being laterally offset with respect to the first buried cavity.

18. The process according to claim 14, further comprising forming, in the first buried cavity, a buried structure, wherein forming the buried structure includes coating at least part of an inside of the first buried cavity with a dielectric coating region.

19. The process claim 18, wherein forming the buried structure further comprises forming an internal dielectric region, which is coated by the dielectric coating region.

20. The process claim 19, wherein the internal dielectric region has a refractive index higher than that of the dielectric coating region.

21. The process according to claim 14, further comprising:
forming an elongated portion of the first front semiconductor region, the elongated portion extending in a direction of elongation, parallel to the top surface; and
forming a confinement structure that, in a plane perpendicular to the direction of elongation, coats top and lateral sides of the elongated portion, said elongated portion forming said first optical guide region and has a bottom side delimited by the first buried cavity.

22. The process according to claim 14, further comprising:
forming, in the semiconductor body, a second buried cavity that extends at a distance from the top surface, is laterally offset with respect to the first buried cavity, and delimits a bottom of a second front semiconductor region of the semiconductor body, is the second front semiconductor region being configured to function as a second optical guide region.

23. An integrated optical device, comprising:
a semiconductor body having a top surface;
a first optical guide that includes:
a first front semiconductor region of the semiconductor body, the first front semiconductor region extending longitudinally in a direction of elongation, parallel to the top surface;
first and second cavities that are positioned on opposite sides of the first front semiconductor region; and
a first buried cavity which extends in the semiconductor body, at a distance from the top surface, the first front semiconductor region having a bottom defined at least in part by the first buried cavity; and
a confinement structure which, in a plane perpendicular to the direction of elongation, coats top and lateral sides of the first front semiconductor region.

24. The integrated optical device according to claim 23, further comprising an optical source which extends at least in part in the semiconductor body, is laterally offset with respect to the first buried cavity, and is configured to direct an optical beam into the first front semiconductor region.

25. The integrated optical device according to claim 23, further comprising a buried structure which is arranged in the first buried cavity and comprises a dielectric coating region which coats at least part of an inside of the first buried cavity and an internal dielectric region which is coated by the dielectric coating region.

* * * * *